United States Patent
Santra et al.

(10) Patent No.: US 10,718,860 B2
(45) Date of Patent: Jul. 21, 2020

(54) SYSTEM AND METHOD TO IMPROVE RANGE ACCURACY IN FMCW RADAR USING FSK MODULATED CHIRPS

(71) Applicant: Infineon Technologies AG, Neubiberg (DE)

(72) Inventors: Avik Santra, Munich (DE); Thomas Finke, Gilching (DE); Johann Peter Forstner, Steinhoering (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 375 days.

(21) Appl. No.: 15/868,727

(22) Filed: Jan. 11, 2018

(65) Prior Publication Data

US 2019/0212428 A1    Jul. 11, 2019

(51) Int. Cl.
| | |
|---|---|
| *G01S 13/28* | (2006.01) |
| *G01S 13/34* | (2006.01) |
| *G01S 13/18* | (2006.01) |
| *G01S 13/26* | (2006.01) |
| *G01S 13/58* | (2006.01) |

(Continued)

(52) U.S. Cl.
CPC .......... *G01S 13/286* (2013.01); *G01S 7/282* (2013.01); *G01S 7/35* (2013.01); *G01S 7/354* (2013.01); *G01S 7/4865* (2013.01); *G01S 13/18* (2013.01); *G01S 13/26* (2013.01); *G01S 13/341* (2013.01); *G01S 13/343* (2013.01); *G01S 13/347* (2013.01); *G01S 13/584* (2013.01); *H03L 7/06* (2013.01); *H03L 7/0805* (2013.01); *H03L 7/18* (2013.01); *H03L 7/23* (2013.01); *G01S 7/006* (2013.01); *G01S 2007/2883* (2013.01); *G01S 2007/356* (2013.01)

(58) Field of Classification Search
CPC .......... G01S 13/286; G01S 7/35; G01S 7/282; G01S 7/354; G01S 7/4865; G01S 13/18; G01S 13/26; G01S 13/341; G01S 13/343; G01S 13/347; G01S 13/584; G01S 7/006; G01S 2007/2883; G01S 2007/356; H03L 7/06; H03L 7/0805; H03L 7/18; H03L 7/23
USPC ......................................................... 342/95
See application file for complete search history.

(56) References Cited

U.S. PATENT DOCUMENTS

| | | | | |
|---|---|---|---|---|
| 4,910,520 A | * | 3/1990 | Rosen ..................... | G01S 13/90 342/25 A |
| 5,424,742 A | * | 6/1995 | Long .................... | G01C 21/005 342/25 C |

(Continued)

FOREIGN PATENT DOCUMENTS

| | | | | |
|---|---|---|---|---|
| DE | 102012220879 A1 | * | 5/2014 | ............. G01S 13/34 |
| DE | 102012220879 A1 | | 5/2014 | |

(Continued)

*Primary Examiner* — Peter M Bythrow
*Assistant Examiner* — Nuzhat Pervin
(74) *Attorney, Agent, or Firm* — Slater Matsil, LLP

(57) ABSTRACT

A method for determining the range of an object includes transmitting successive radar chirps, adding a frequency offset to the successive radar chirps, the frequency offset being a fraction of a range frequency bin, receiving return signals, constructing frequency transforms from each of the return signals, adding each of the frequency transforms together to create a composite frequency transform, and interpolating the range of the object from a frequency peak detected in the composite frequency transform.

20 Claims, 16 Drawing Sheets

(51) Int. Cl.

| | |
|---|---|
| *G01S 7/282* | (2006.01) |
| *G01S 7/4865* | (2020.01) |
| *H03L 7/06* | (2006.01) |
| *H03L 7/18* | (2006.01) |
| *H03L 7/23* | (2006.01) |
| *H03L 7/08* | (2006.01) |
| *G01S 7/35* | (2006.01) |
| *G01S 7/288* | (2006.01) |
| *G01S 7/00* | (2006.01) |

(56) References Cited

U.S. PATENT DOCUMENTS

| | | | | |
|---|---|---|---|---|
| 5,430,445 A * | 7/1995 | Peregrim | ................ | F41G 7/343 342/25 C |
| 5,589,838 A * | 12/1996 | McEwan | ............... | G01F 23/284 342/387 |
| 5,608,404 A * | 3/1997 | Burns | ................... | G01S 13/90 342/25 A |
| 6,437,729 B1 * | 8/2002 | Mattox | ................... | G01S 13/58 342/106 |
| 7,048,973 B2 * | 5/2006 | Sakamoto | ............... | C23C 16/14 427/250 |
| 7,986,397 B1 * | 7/2011 | Tiemann | ................. | G01S 17/89 356/5.09 |
| 9,170,070 B2 * | 10/2015 | Sharpin | ..................... | F41G 7/00 |
| 9,194,947 B1 * | 11/2015 | Mohamed | ............ | G01S 13/582 |
| 9,551,552 B2 * | 1/2017 | Kolanek | ..................... | F41G 7/007 |
| 10,128,886 B1 * | 11/2018 | Barnard | ..................... | H04B 15/06 |
| 10,295,312 B2 * | 5/2019 | Sharpin | ..................... | F42B 15/01 |
| 2002/0027522 A1 * | 3/2002 | Tullsson | ................... | G01S 7/023 342/196 |
| 2004/0150552 A1 * | 8/2004 | Barbella | ................. | G01S 13/53 342/109 |
| 2006/0262007 A1 * | 11/2006 | Bonthron | ................ | G01S 13/44 342/70 |
| 2007/0120731 A1 * | 5/2007 | Kelly, Jr. | ................... | G01S 7/36 342/159 |
| 2007/0285302 A1 * | 12/2007 | Aarseth | ................ | G01S 13/904 342/25 R |
| 2010/0054626 A1 * | 3/2010 | Shi | ........................ | A61B 5/7257 382/280 |
| 2012/0075138 A1 * | 3/2012 | Stayton | ................... | G01S 13/74 342/120 |
| 2012/0235854 A1 * | 9/2012 | Testar | ....................... | G01S 7/35 342/109 |
| 2015/0160331 A1 * | 6/2015 | Lynch | ................. | G01S 13/4418 342/105 |
| 2016/0047891 A1 * | 2/2016 | Campbell | ............... | G01S 17/32 702/150 |
| 2016/0061942 A1 * | 3/2016 | Rao | .......................... | G01S 7/35 342/109 |
| 2016/0097671 A1 * | 4/2016 | Faber | ................... | G01F 23/0069 342/124 |
| 2016/0103216 A1 * | 4/2016 | Whelan | ................. | G01S 7/2923 342/25 A |
| 2017/0016979 A1 * | 1/2017 | Cho | ...................... | G01S 7/4004 |
| 2017/0160381 A1 * | 6/2017 | Cho | ....................... | G01S 13/90 |
| 2018/0031688 A1 * | 2/2018 | Hesse | ..................... | G01S 13/343 |
| 2018/0094964 A1 * | 4/2018 | Eriksson | ................. | G01S 13/88 |
| 2019/0086531 A1 * | 3/2019 | Rick | ..................... | G01S 13/582 |
| 2019/0339374 A1 * | 11/2019 | Kageme | ................ | G01S 13/524 |

FOREIGN PATENT DOCUMENTS

| | | | | |
|---|---|---|---|---|
| EP | 3324201 A1 | 5/2018 | | |
| WO | 2016033361 A1 | 3/2016 | | |
| WO | WO-2017149596 A1 * | 9/2017 | .......... | G01S 13/003 |
| WO | 2017149596 A1 | 3/2018 | | |
| WO | WO-2019215733 A1 * | 11/2019 | ............ | G01S 13/34 |

\* cited by examiner

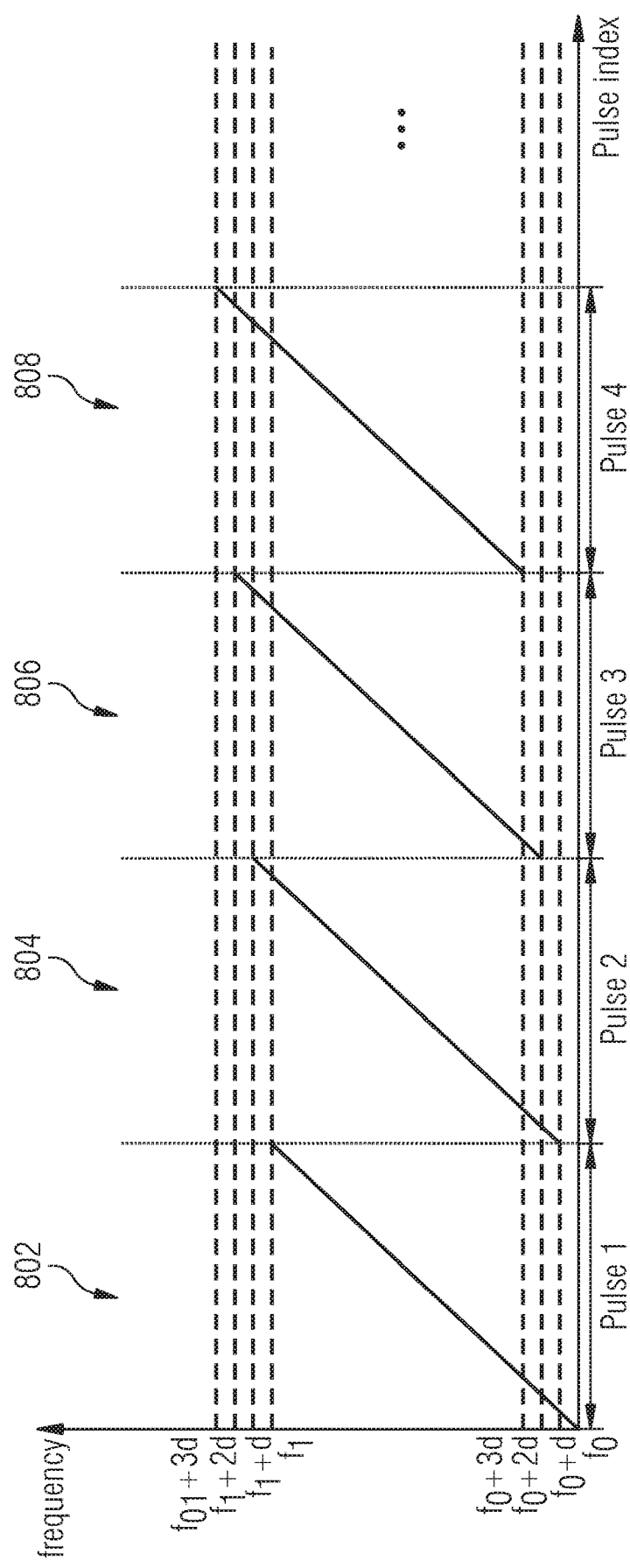

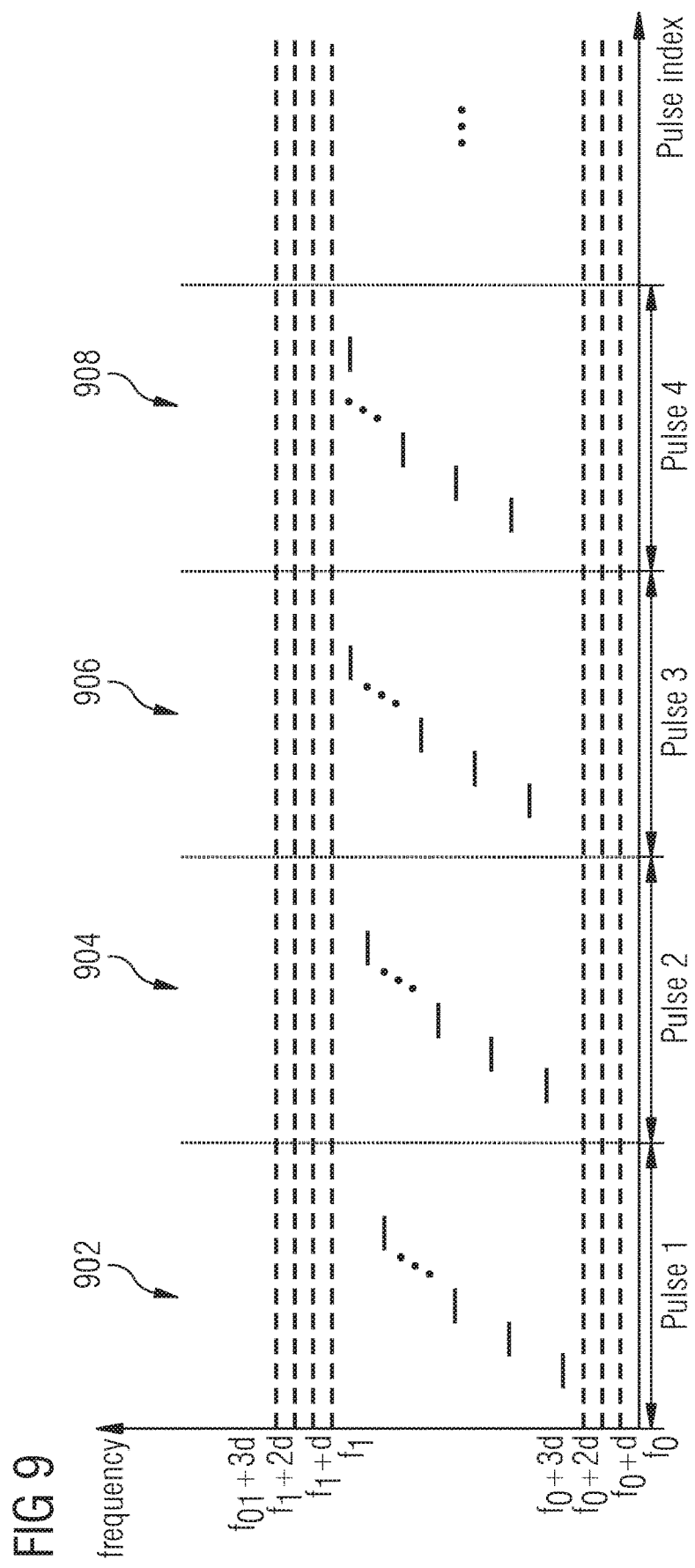

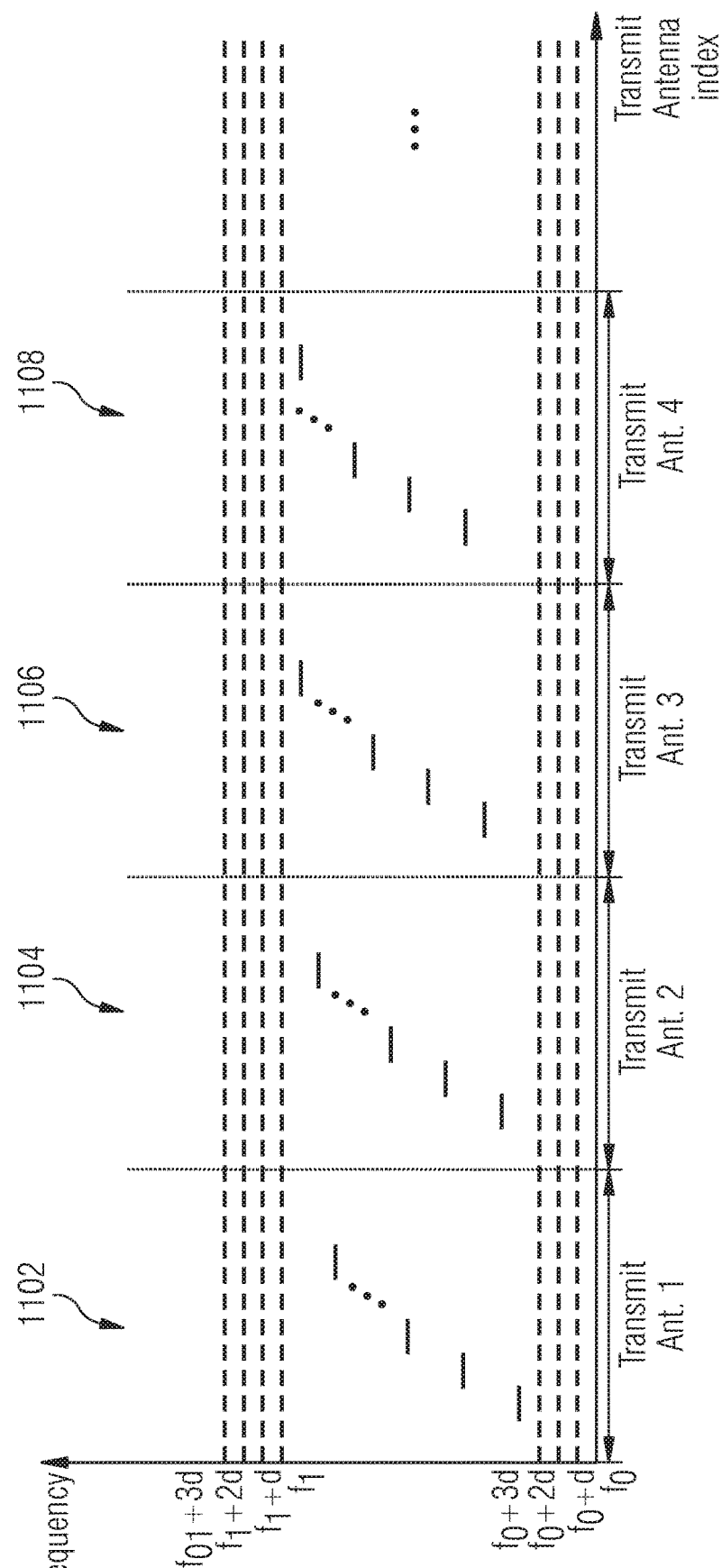

○ Discrete frequency points seen by FFT on Pulse 1

⊗ Discrete frequency points seen by FFT on Pulse 2

⋈ Discrete frequency points seen by FFT on Pulse 3

◇ Discrete frequency points seen by FFT on Pulse 4

○ FFT Points from Pulse 1 — 1202
⊗ FFT Points from Pulse 2 — 1204
⨉ FFT Points from Pulse 3 — 1206
◇ FFT Points from Pulse 4 — 1208

SYSTEM AND METHOD TO IMPROVE RANGE ACCURACY IN FMCW RADAR USING FSK MODULATED CHIRPS

TECHNICAL FIELD

The present invention relates generally to a system and method for improving range accuracy in Frequency-Modulated Continuous-Wave (FMCW) radar using Frequency Shift Keying (FSK) modulated chirps.

BACKGROUND

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Accordingly, some radar systems include a transmit antenna to transmit the RF signal, a receive antenna to receive the RF, as well as the associated RF circuitry used to generate the transmitted signal and to receive the RF signal. In some cases, multiple antennas may be used to implement directional beams using phased array techniques.

In industrial applications, accurately estimating radar range is of interest to the radar community. In FMCW stretch processing, the target range resolution and thereby its accuracy is limited by radar bandwidth. Range resolution is the ability of a radar system to distinguish between two or more targets on the same bearing but at different ranges. The degree of range resolution depends on the width of the radar bandwidth, transmitted pulse, the types and sizes of targets, and the efficiency of the receiver and indicator.

SUMMARY

According to an embodiment, a method for determining the range of an object comprises transmitting a plurality of successive radar chirps; adding a frequency offset to at least one of the plurality of successive radar chirps such that the frequency offset occurs between each of the plurality of successive radar chirps, the frequency offset being a fraction of a range frequency bin; receiving a corresponding plurality of return signals; constructing a plurality of frequency transforms from the plurality of return signals; adding each of the frequency transforms together to create a composite frequency transform; and interpolating the range of the object from a frequency peak detected in the composite frequency transform.

According to another embodiment, a system for determining the range of an object comprises at least one antenna configured for transmitting a plurality of successive radar chirps; a transmitter configured for adding a frequency offset to at least one of the plurality of successive radar chirps such that the frequency offset occurs between each of the plurality of successive radar chirps, the frequency offset being a fraction of a range frequency bin; at least one antenna configured for receiving a corresponding plurality of return signals; and a receiver configured for constructing a plurality of frequency transforms from the plurality of return signals, adding each of the frequency transforms together to create a composite frequency transform, and interpolating the range of the object from a frequency peak detected in the composite frequency transform.

According to another embodiment, a method for determining the range of an object comprises transmitting a plurality of pulses; adding a frequency offset to at least one of the plurality of pulses; receiving a plurality of return signals; constructing a plurality of frequency transforms from the plurality of return signals; adding each of the frequency transforms together to create a composite frequency transform; and determining the range of the object from a maximum frequency peak in the composite frequency transform.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 is a timing diagram illustrating consecutive pulses using the sawtooth frequency sweeps of FIGS. 6A-6D;

FIG. 9 is a timing diagram illustrating consecutive pulses using the staircase frequency sweeps of FIGS. 7A-7D;

FIG. 11 is a timing diagram illustrating a multiple antenna embodiment using the staircase frequency sweeps of FIG. 7A-7D;

DETAILED DESCRIPTION OF ILLUSTRATIVE EMBODIMENTS

Figure 1:
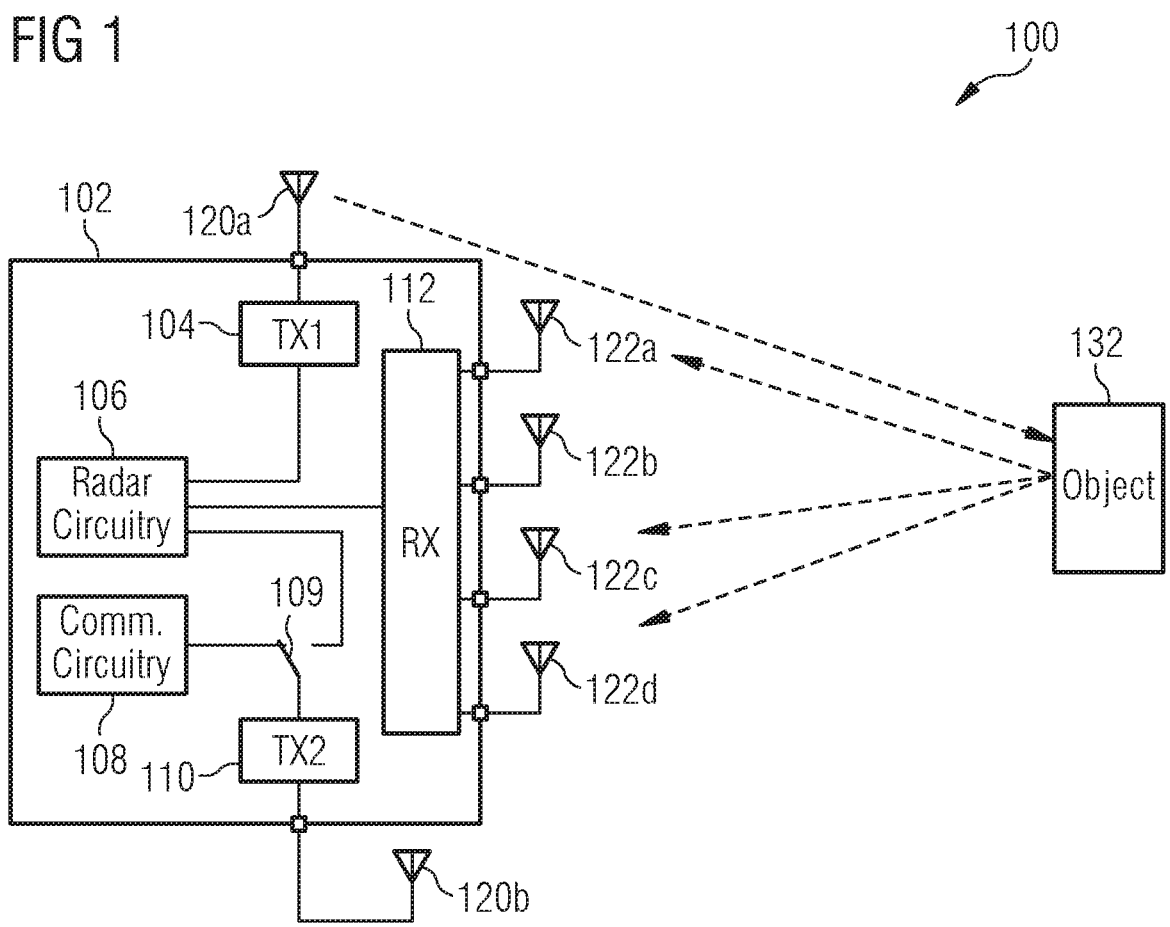
FIG. 1 is a block diagram of an embodiment radar system.

FIG. 1 illustrates radar system 100 according to an embodiment of the present invention. As shown, radar transceiver device 102 is configured to transmit an incident RF signal via transmit antenna 120a and/or transmit antenna 120b, and receive a reflected RF signal via an antenna array that includes receive antennas 122a-d. Radar transceiver device 102 includes receiver front end 112 coupled to receive antennas 122a-d, first transmitter front end 104 coupled to transmit antenna 120a and second transmitter front end 110 coupled to transmit antenna 120b. Radar circuitry 106 provides signals to be transmitted to first and second transmitter front ends 104 and 110 and receives and/or processes signals received by receiver front end 112. Object 132 receives the transmitted RF signals and generates the reflected RF signals in an embodiment.

In an embodiment, the input to second transmitter front end 110 is selectable between an output of radar circuitry 106 and an output of communication circuitry 108 via a circuit represented by switch 109. When second transmitter front end 110 receives input from radar circuitry 106, both first transmitter front end 104 and second transmitter front end 110 can be used to build a holographic radar.

In an embodiment, radar transceiver device 102, or portions of radar transceiver device 102 may be implemented in a package that contains first transmitter front end 104, second transmitter front end 110, receiver front end 112, as well as transmit antennas 120a and 120b and receive antennas 122a-d.

In an embodiment, the frequency of operation of radar system 100, as well as other embodiments, disclosed herein, is between about 57 GHz and about 66 GHz. Alternatively, embodiment systems may operate at frequencies outside of this range also.

Figure 2:
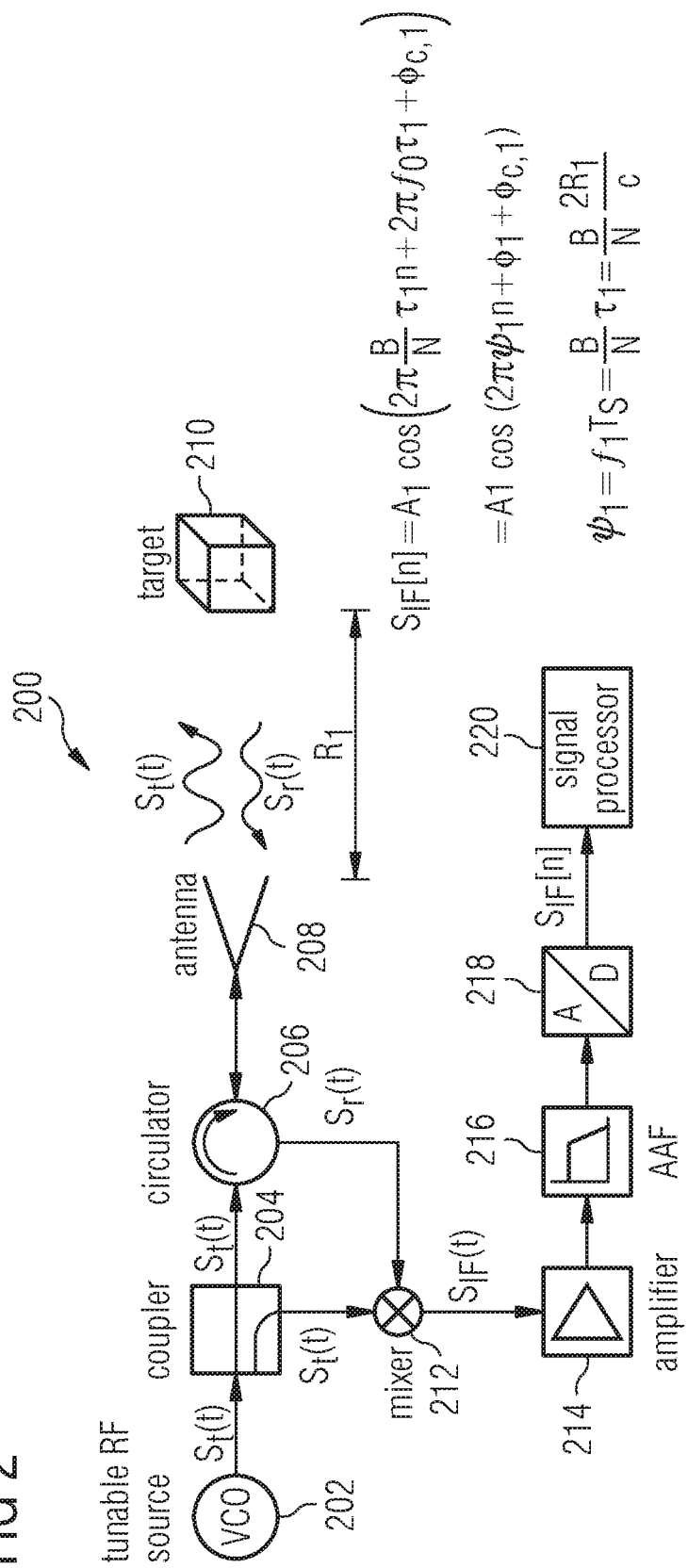
FIG. 2 is a more detailed block diagram of an embodiment FMCW radar.

FIG. 2 is a block diagram of an example FMCW radar 200. Radar 200 includes a tunable RF source, such as Voltage-Controlled Oscillator (VCO) 202 for generating RF transmit signal $s_t(t)$. The RF transmit signal $s_t(t)$ is received by coupler 204 for generating first and second RF transmit signals. A first RF transmit signal is received by circulator 206 for transferring to antenna 208 through a first port. A second RF transmit signal is received by mixer 212. Antenna 208 is also used to receive a receive signal $s_r(t)$, which is received by circulator 206 and transferred to mixer 212 through a second port. Mixer 212 generates an intermediate frequency (IF) signal $S_{IF}(t)$. The IF signal is a sinusoidal signal, and the range R1 of target 210 is embedded in the frequency and phase. The IF signal is received by an amplifier 214 and filtered by filter 216. The analog output signal of filter 216 is converted into a digital signal $s_{IF}[n]$ by A/D converter 218. The IF digital signal is processed by signal processor 220 to extract the range R1.

Figure 3:
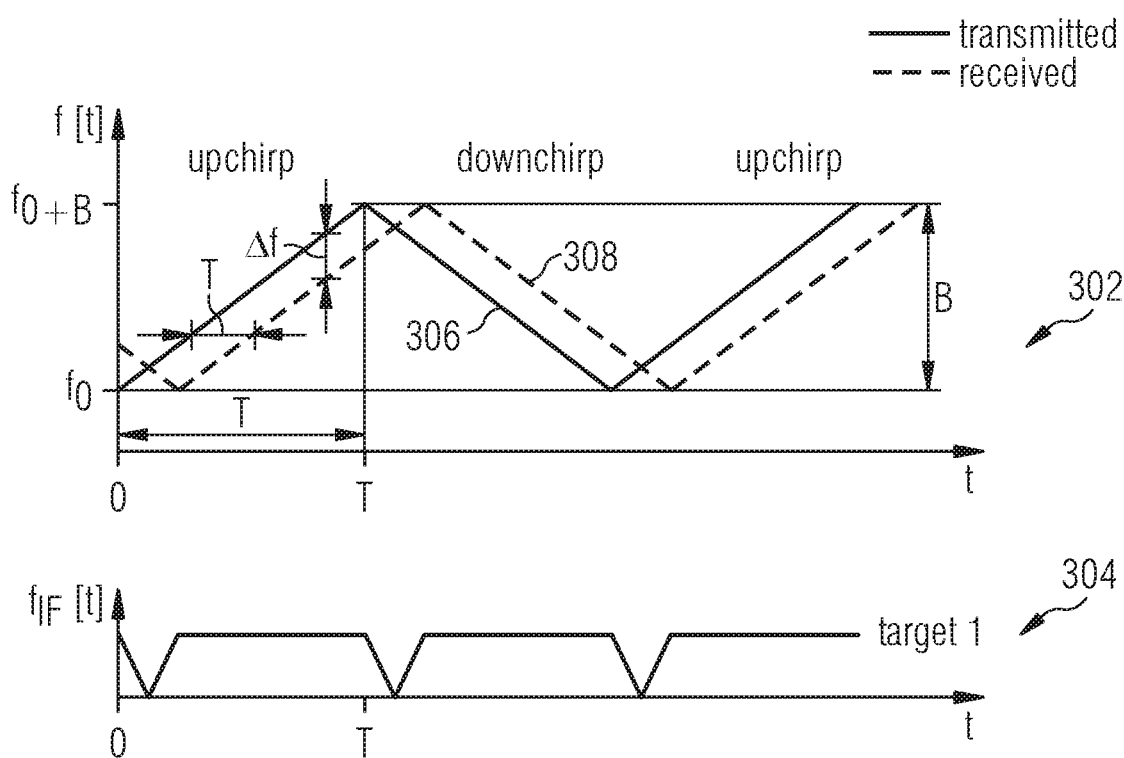
FIG. 3 is a timing diagram of FMCW radar chirps.

FIG. 3 shows an example of FMCW radar chirps 302 including a transmit signal 306 and a receive signal 308. Upchirp and downchirp portions of the radar chirps 302 are shown. Only the upchirp portion is used, in an embodiment. Also shown in FIG. 3 is an intermediate signal 304 that corresponds to the particular transmit signal 306 and receive signal 308 shown.

However in an embodiment up-chirp and down-chirps can both be used for estimating the range and Doppler accuracy by adding and subtracting the maximum FFT index. The range and Doppler accuracy are both improved. The corresponding frequency equations are shown below for this embodiment:

$$f\_r=f\_max\_up-f\_max\_down \text{ and } f\_d=f\_max\_up+f\_max\_down.$$

Referring to FIGS. 2 and 3, the receive signal processing of the system model is explained as follows in the following steps: mix/beat the received radar signals (multiply in time domain) with the transmit signal (also referred to as de-chirping/de-ramping/de-stretching); due to a second order time term, the time delay from target presents itself as a beat sinusoidal frequency; two sinusoidal terms are derived—the higher order frequency term is filtered out through analog low-pass filtering; perform an FFT on the filtered signal to calculate the range of the target; improve the spectrum output with windowing, zero padding; and de-stretch the receive signal with a no frequency offset Linear Frequency Modulated (LFM) pulse, which refers to the first pulse where the receive and the transmit waveform are the same. For example, $f_o$=carrier frequency=24 Ghz or 60 Ghz, B=Bandwidth=250 Mhz or 7 Ghz, T=chirp time=35 µs to 1.5 ms.

Figure 4:
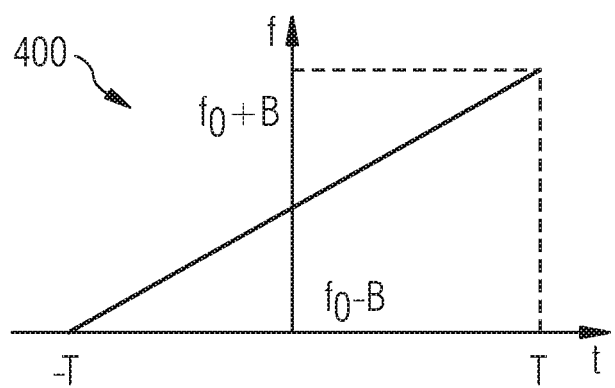
FIG. 4 is a timing diagram of a sawtooth linear frequency modulated sweep signal.
Figure 5:
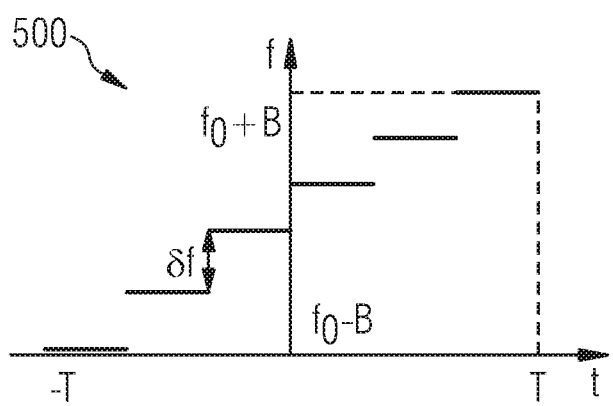
FIG. 5 is a timing diagram of a staircase frequency modulated sweep signal.

FIGS. 4 and 5 show examples of LFM sweep signal types. FIG. 4 shows a sawtooth linear frequency modulated sweep signal 400 that can be transmitted from a time −T to a time T, and from a frequency of f0−B to f0+B as shown. FIG. 5 shows a staircase linear frequency modulated sweep signal 500 that can be transmitted from a time −T to a time T, and from a frequency of f0−B to f0+B as shown. The frequency difference between each of the steps is shown as δf.

Referring now to FIGS. 6A-6D a sawtooth frequency sweep is shown according to an embodiment. Frequency offsets are added to four consecutive LFM transmit pulses that are equivalent to 0.25 times the range of the frequency bins used. The receive signal is de-stretched with a no frequency offset LFM pulse. While four consecutive LFM transmit pulses are shown with a frequency offset of 0.25 times the range of the frequency bins used, other numbers of consecutive LFM transmit pulses can be used. For example, eight consecutive LFM transmit pulses could be used, having a frequency offset of 0.125 times the range of the frequency bins used. In another example, ten consecutive LFM transmit pulses could be used, having a frequency offset of 0.1 times the range of the frequency bins used. In yet another example, "n" consecutive LFM transmit pulses could be used, having a frequency offset of "1/n" times the range of the frequency bins used. The accuracy of determining the range of the target is improved by increasing numbers of LFM transmit pulses.

Figure 6A:
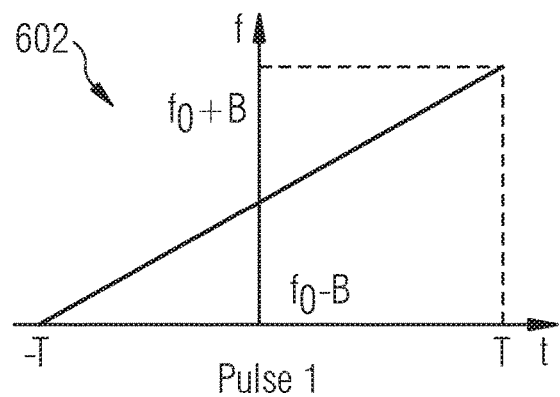
FIGS. 6A-6D are timing diagrams of sawtooth frequency sweeps according to an embodiment.
Figure 6B:
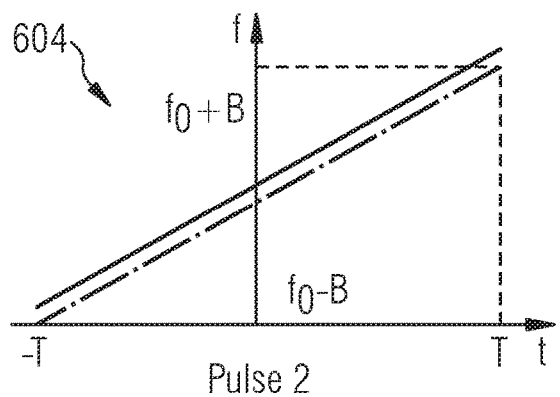
Figure 6C:
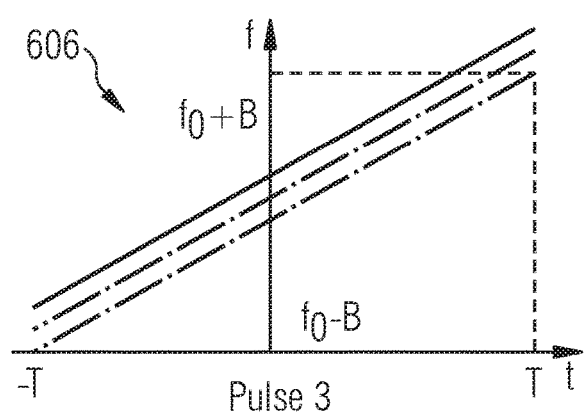
Figure 6D:
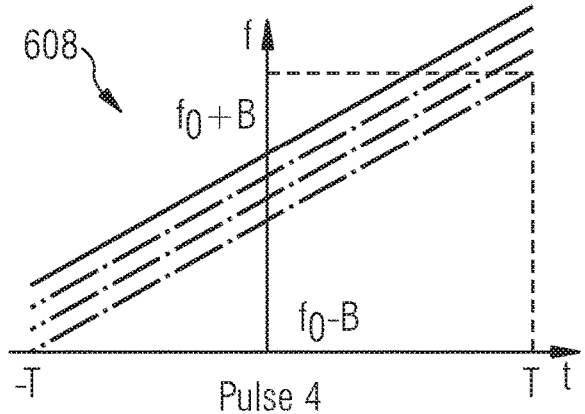

FIG. 6A shows a sawtooth frequency sweep signal (Pulse 1) 602 with no frequency offset. FIG. 6B shows a sawtooth sweep signal (Pulse 2) 604 with a first frequency offset of (N*0.25) times the range of the frequency bins used, wherein N=1. FIG. 6C shows a sawtooth sweep signal (Pulse 3) 606 with a second frequency offset of (N*0.25) times the range of the frequency bins used, wherein N=2. The N=1 frequency offset is also shown in FIG. 6C. FIG. 6D shows a sawtooth sweep signal (Pulse 4) 608 with a third frequency offset of (N*0.25) times the range of the frequency bins used, wherein N=3. The N=1 and N=2 frequency offsets are also shown in FIG. 6D.

Figure 7A:
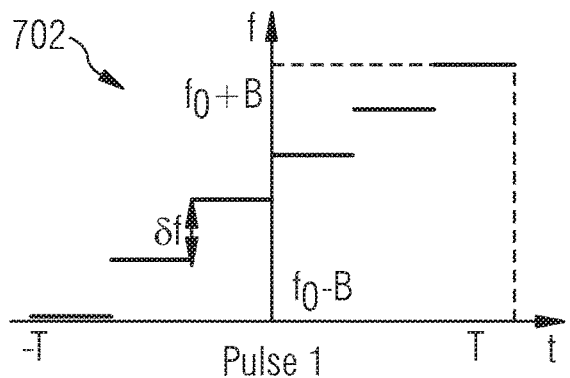
FIGS. 7A-7D are timing diagrams of staircase frequency sweeps according to an embodiment.
Figure 7B:
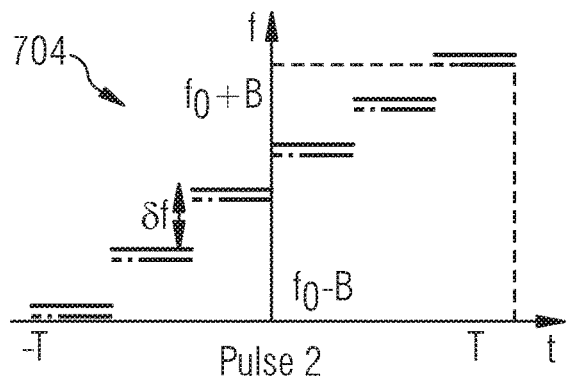
Figure 7C:
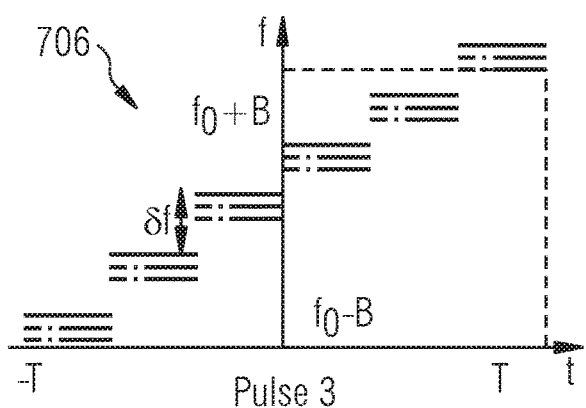
Figure 7D:
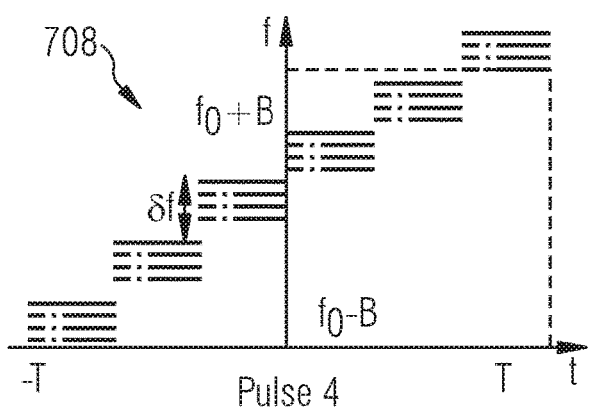

Similarly, FIG. 7A shows a staircase sweep signal (Pulse 1) 702 with no frequency offset. The frequency difference between each of the steps is again shown as δf. FIG. 7B shows a staircase sweep signal (Pulse 2) 704 with a first frequency offset of (N*0.25) times the range of the frequency bins used, wherein N=1. FIG. 7C shows a staircase sweep signal (Pulse 3) 706 with a second frequency offset of (N*0.25) times the range of the frequency bins used, wherein N=2. The N=1 frequency offset is also shown in FIG. 7C. FIG. 7D shows a staircase sweep signal (Pulse 4) 708 with a third frequency offset of (N*0.25) times the range of the frequency bins used, wherein N=3. The N=1 and N=2 frequency offsets are also shown in FIG. 7D.

Consecutive frequency-offset LFM pulses are shown in FIGS. 8 and 9 that can be used, for example in a single transmit antenna embodiment. The consecutive pulse embodiment shown in FIGS. 8 and 9 leverages combining LFM and FSK modulation to more effectively improve the radar range resolution (compared to consecutive transmit pulses that do not include the frequency offsets). The consecutive pulses are processed together for an estimate and interpolates radar measurements within a range bin. The embodiment shown in FIGS. 8 and 9 reduces range-gate straddling loss and improves the radar range accuracy as will be explained in further detail below.

FIG. 8 shows four consecutive pulses 802, 804, 806, and 808 using the sawtooth frequency sweep previously discussed with respect to FIGS. 6A-6D. A first pulse (Pulse 1)

802 is swept from a first frequency f0 to a second frequency f1. A second pulse (Pulse 2) 804 is swept from a first shifted frequency f0+d to a second shifted frequency f1+d, wherein "d" is equal to 0.25 time the range of the frequency bin used to analyze the radar return signals. In the example embodiment shown in FIG. 8, recall that the offsets are set at 0.25 times the bin range since four consecutive pulses are used. Different numbers of consecutive pulses, with a correspondingly different frequency offset "d" can be used as previously discussed. A third pulse (Pulse 3) 806 is swept from a first shifted frequency f0+2d to a second shifted frequency f1+2d. A fourth pulse (Pulse 4) 808 is swept from a first shifted frequency f0+3d to a second shifted frequency f1+3d. The sequence of pulses 802, 804, 806, and 808 is then repeated and transmitted with a single transmit antenna, in an embodiment.

FIG. 9 shows four consecutive pulses 902, 904, 906, and 908 using the staircase frequency sweep previously discussed with respect to FIGS. 7A-7D. A first pulse (Pulse 1) 902 is swept from a first frequency f0 to a second frequency f1. A second pulse (Pulse 2) 904 is swept from a first shifted frequency f0+d to a second shifted frequency f1+d, wherein "d" is equal to 0.25 time the range of the frequency bin used to analyze the radar return signals. In the example embodiment shown in FIG. 9, recall that the offsets are set at 0.25 times the bin range since four consecutive pulses are used. Different numbers of consecutive pulses, with a correspondingly different frequency offset "d" can be used as previously discussed. A third pulse (Pulse 3) 906 is swept from a first shifted frequency f0+2d to a second shifted frequency f1+2d. A fourth pulse (Pulse 4) 908 is swept from a first shifted frequency f0+3d to a second shifted frequency f1+3d. The sequence of pulses 902, 904, 906, and 908 is then repeated and transmitted with a single transmit antenna, in an embodiment.

Figure 10:
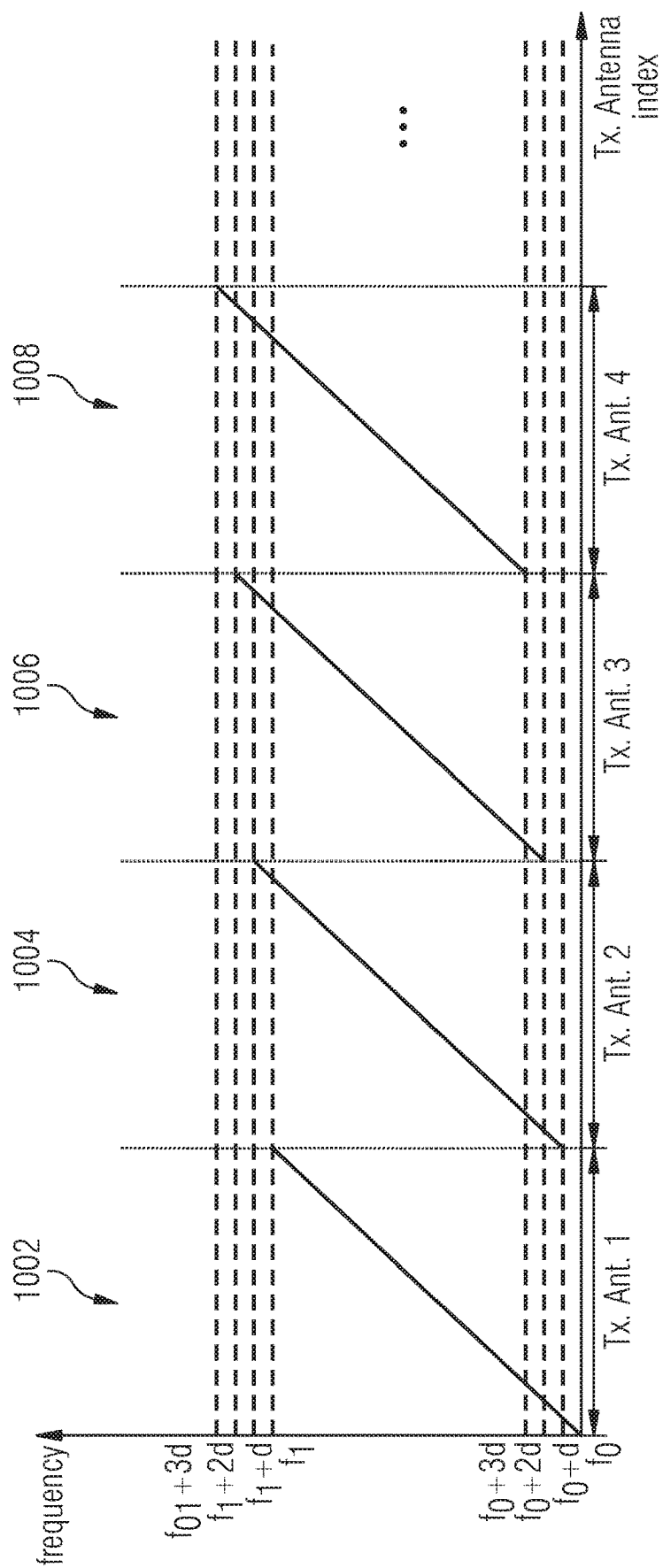
FIG. 10 is a timing diagram illustrating a multiple antenna embodiment using the sawtooth frequency sweeps of FIGS. 6A-6D.

Consecutive frequency-offset LFM pulses are shown in FIGS. 10 and 11 that can be used, for example in a multiple transmit antenna embodiment. The consecutive pulse embodiment shown in FIGS. 10 and 11 also leverages combining LFM and FSK modulation to more effectively improve the radar range resolution (compared to consecutive transmit pulses that do not include the frequency offsets and compared to the single antenna embodiment of FIGS. 8 and 9). The consecutive pulses are processed together for an estimate and interpolates radar measurements within a range bin. The embodiment shown in FIGS. 10 and 11 further reduces range-gate straddling loss and improves the radar range accuracy as will be explained in further detail below.

FIG. 10 shows four consecutive pulses 1002, 1004, 1006, and 1008 using the sawtooth frequency sweep previously discussed with respect to FIGS. 6A-6D. A first pulse (Tx. Ant. 1) 1002 is swept from a first frequency f0 to a second frequency f1 and is transmitted on a first antenna. A second pulse (Tx. Ant. 2) 1004 is swept from a first shifted frequency f0+d to a second shifted frequency f1+d and is transmitted on a second antenna, wherein "d" is equal to 0.25 times the range of the frequency bin used to analyze the radar return signals. In the example embodiment shown in FIG. 100, recall that the offsets are set at 0.25 times the bin range since four consecutive pulses are used. Different numbers of consecutive pulses, with a correspondingly different frequency offset "d" can be used as previously discussed. A third pulse (Tx. Ant. 3) 1006 is swept from a first shifted frequency f0+2d to a second shifted frequency f1+2d and is transmitted on a third antenna. A fourth pulse (Pulse 4) 1008 is swept from a first shifted frequency f0+3d to a second shifted frequency f1+3d and is transmitted on a fourth antenna. The sequence of pulses 1002, 1004, 1006, and 1008 is then repeated and transmitted with multiple transmit antennas, in an embodiment. Other numbers of transmit antennas and corresponding frequency offsets can be used.

FIG. 11 shows four consecutive pulses 1102, 1104, 1106, and 1108 using the staircase frequency sweep previously discussed with respect to FIGS. 7A-7D. A first pulse (Tx. Ant. 1) 1102 is swept from a first frequency f0 to a second frequency f1 and is transmitted on a first antenna. A second pulse (Tx. Ant. 2) 1104 is swept from a first shifted frequency f0+d to a second shifted frequency f1+d and is transmitted on a second antenna, wherein "d" is equal to 0.25 time the range of the frequency bin used to analyze the radar return signals. In the example embodiment shown in FIG. 11, recall that the offsets are set at 0.25 times the bin range since four consecutive pulses are used. Different numbers of consecutive pulses, with a correspondingly different frequency offset "d" can be used as previously discussed. A third pulse (Tx. Ant. 3) 1106 is swept from a first shifted frequency f0+2d to a second shifted frequency f1+2d and is transmitted on a third antenna. A fourth pulse (Pulse 4) 1108 is swept from a first shifted frequency f0+3d to a second shifted frequency f1+3d and is transmitted on a fourth antenna. The sequence of pulses 1102, 1104, 1106, and 1108 is then repeated and transmitted with multiple transmit antennas, in an embodiment. Other numbers of transmit antennas and corresponding frequency offsets can be used.

Figure 12A:
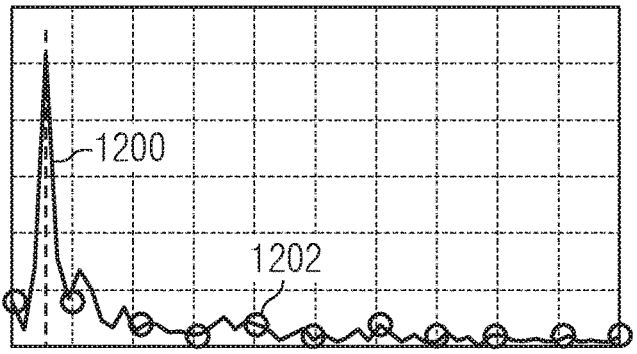
FIGS. 12A-12D are diagrams of frequency-shifted FFTs of return signals according to an embodiment.
Figure 12B:
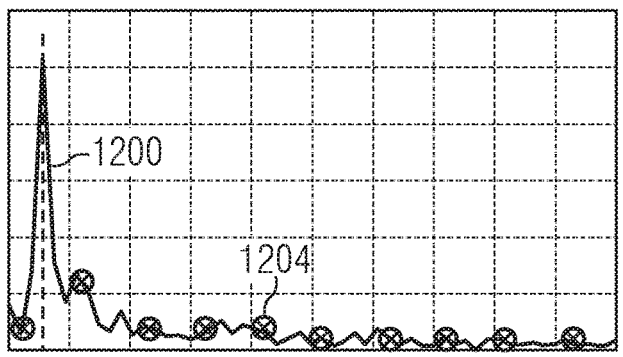
Figure 12C:
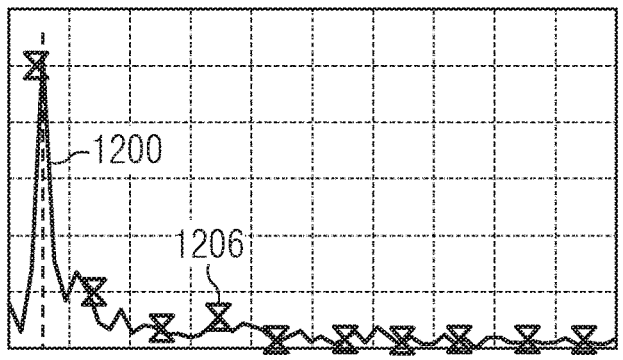
Figure 12D:
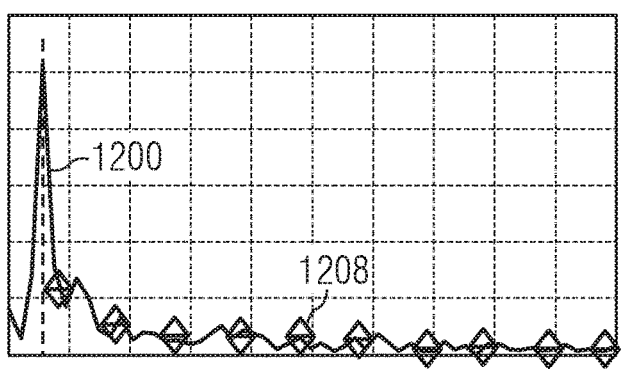

FIGS. 12A-12D illustrate four FFTs of the IF beat signal from consecutive return signals corresponding to the previously described transmit pulses. Recall that the transmit pulses and corresponding return signals are frequency shifted by frequency offsets as previously discussed. FIG. 12A shows a plurality of discrete frequency points 1202 in each frequency bin seen by a first FFT corresponding to a first pulse. FIG. 12B shows a plurality of discrete frequency points 1204 in each frequency bin seen by a second FFT corresponding to a second pulse. FIG. 12C shows a plurality of discrete frequency points 1206 in each frequency bin seen by a third FFT corresponding to a third pulse. FIG. 12D shows a plurality of discrete frequency points 1208 in each frequency bin seen by a fourth FFT corresponding to a fourth pulse. A reconstructed FFT spectrum 1200 is shown in each of FIGS. 12A, 12B, 12C, and 12D and is explained in further detail below. While four FFTs are shown in FIGS. 12A-12D any number may be used according to the number of consecutive transmit pulses used.

Figure 13:
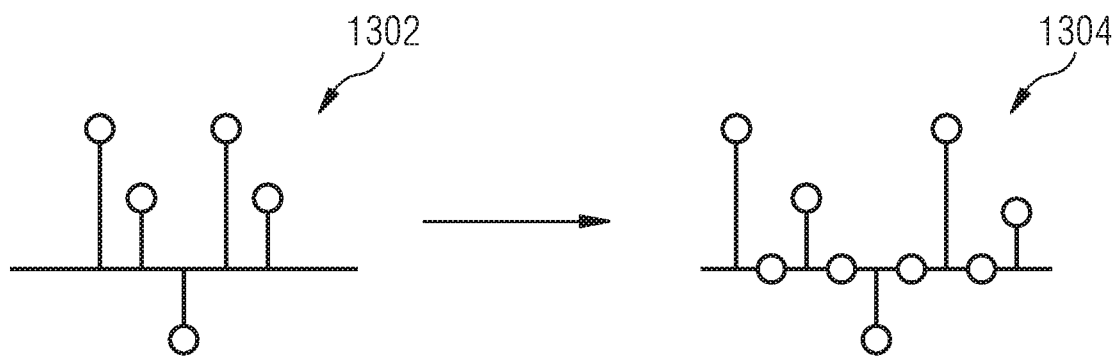
FIG. 13 is a diagram of an N-point zero-inserted FFT according to an embodiment.

Referring now to FIG. 13, a diagram of an FFT 1302 and a diagram of a corresponding N-point zero-inserted FFT 1304 are shown, wherein N=2, according to an embodiment. The FFTs shown in, for example FIGS. 12A-12D are all N-point zero-inserted, in which case N=4. In FIG. 13, note that there is "zero insert" between each of the data points of FFT 1302 to produce the zero-inserted FFT 1304. In the FFTs of FIGS. 12A-12D, wherein N=4, there are three zero inserts between each data point, so that all of the frequency shifted FFTs can be combined by simple addition to produce a composite FFT. The composite FFT is shown in FIG. 14 and described in further detail below.

Figure 14:
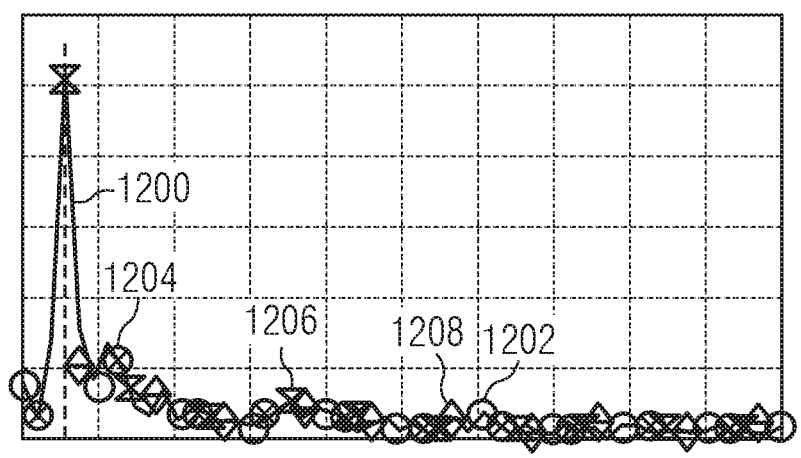
FIG. 14 is a diagram of a reconstructed FFT from consecutive return pulses according to an embodiment.

FIG. 14 illustrates a reconstructed FFT 1200 that is reconstructed from consecutive frequency-shifted pulses as previously described. The FFT 1200 spectrum is interleaved from the individual zero-insert FFTs illustrated in FIGS. 12A-12D. The fixed frequency offsets in the consecutive transmit pulses in principle work to interpolate the FFT measurement data between range bins in the reconstructed FFT spectrum. In other words, the reconstructed FFT 1200 spectrum shown in FIG. 14 may reveal peaks that would not be evident when using pulses that do not include frequency offsets.

The solid line 1200 represents the physical target response represented by the target impulse response. This ideal target response can be provided only by continuous-time processing. The dotted points 1202, 1204, 1206, and 1208 over the spectrum represents the FFT output points that are observed respectively using the individual FFTs on the first pulse, the second pulse, the third pulse, and the fourth pulse. Note that in the illustrative example of FIG. 14, the third FFT 1206 (resulting from 2d shifted transmit FMCW pulse) captures the peak of the spectrum. In a conventional system, analysis of the return signal is limited to only the first FFT, thus missing the actual/accurate target peak frequency and hence the range estimation is adversely affected (less accurate).

The pertinent equations for the demodulation and transmitted chirps according to an embodiment are given below:

Receiver demodulation chirp signal $$u(t) = A_c \cos\left(\omega_c t + \frac{A_b}{2} t^2\right)$$

Received chirp from pulse 1 with target at $$\tau = \frac{2R}{c}$$

$$v_1(t-\tau) = A_c \cos\left(\omega_c(t-\tau) + \frac{A_b}{2}(t-\tau)^2\right)$$

Received chirp from pulse 2 with initial frequency shift of $\delta\omega_c$ $$v_2(t-\tau) = A_c \cos\left((\omega_c + \delta\omega_c)(t-\tau) + \frac{A_b}{2}(t-\tau)^2\right)$$

Similarly, Received chirp from pulse 3

$$v_3(t-\tau) = A_c \cos\left((\omega_c + 2\delta\omega_c)(t-\tau) + \frac{A_b}{2}(t-\tau)^2\right)$$

Similarly, Received chirp from pulse 4

$$v_4(t-\tau) = A_c \cos\left((\omega_c + 3\delta\omega_c)(t-\tau) + \frac{A_b}{2}(t-\tau)^2\right)$$

The pertinent IF beat signal from consecutive pulses equations are given below:

IF Signal from Pulse 1

$$v_1(t-\tau) * u(t) = \frac{A_c^2}{2}\left[\cos\left((2\omega_c - A_b\tau)t + A_b t^2 + \left(\frac{A_b}{2}\tau^2 - \omega_c\tau\right)\right) + \right.$$

-continued $$\left. \cos\left(A_b\tau t + \left(\omega_c\tau - \frac{A_b}{2}\tau^2\right)\right)\right]$$

Filtering out higher frequency term, the instantaneous frequency representing target is $$f_b^1 = \frac{1}{2\pi}\frac{d}{dt}\left\{A_b\tau t + \left(\omega_c\tau - \frac{A_b}{2}\tau^2\right)\right\} = \frac{A_b}{2\pi}\tau$$

Filtered IF Beat Signal from Pulse 2

$$\frac{A_c^2}{2}\cos\left((A_b\tau - \delta\omega_c)t + \left((\omega_c + \delta\omega_c)\tau - \frac{A_b}{2}\tau^2\right)\right)$$

Instantaneous target frequency term from Pulse 2 then is $$f_b^2 = \frac{1}{2\pi}\frac{d}{dt}\left\{(A_b\tau - \delta\omega_c)t + \left(\omega_c\tau - \frac{A_b}{2}\tau^2\right)\right\} = \frac{A_b}{2\pi}\tau - \delta\omega_c$$

IF Signal from Pulse 3 & Pulse 4 are $$f_b^3 = \frac{A_b}{2\pi}\tau - 2\delta\omega_c$$

$$f_b^4 = \frac{A_b}{2\pi}\tau - 3\delta\omega_c$$

Figure 15:
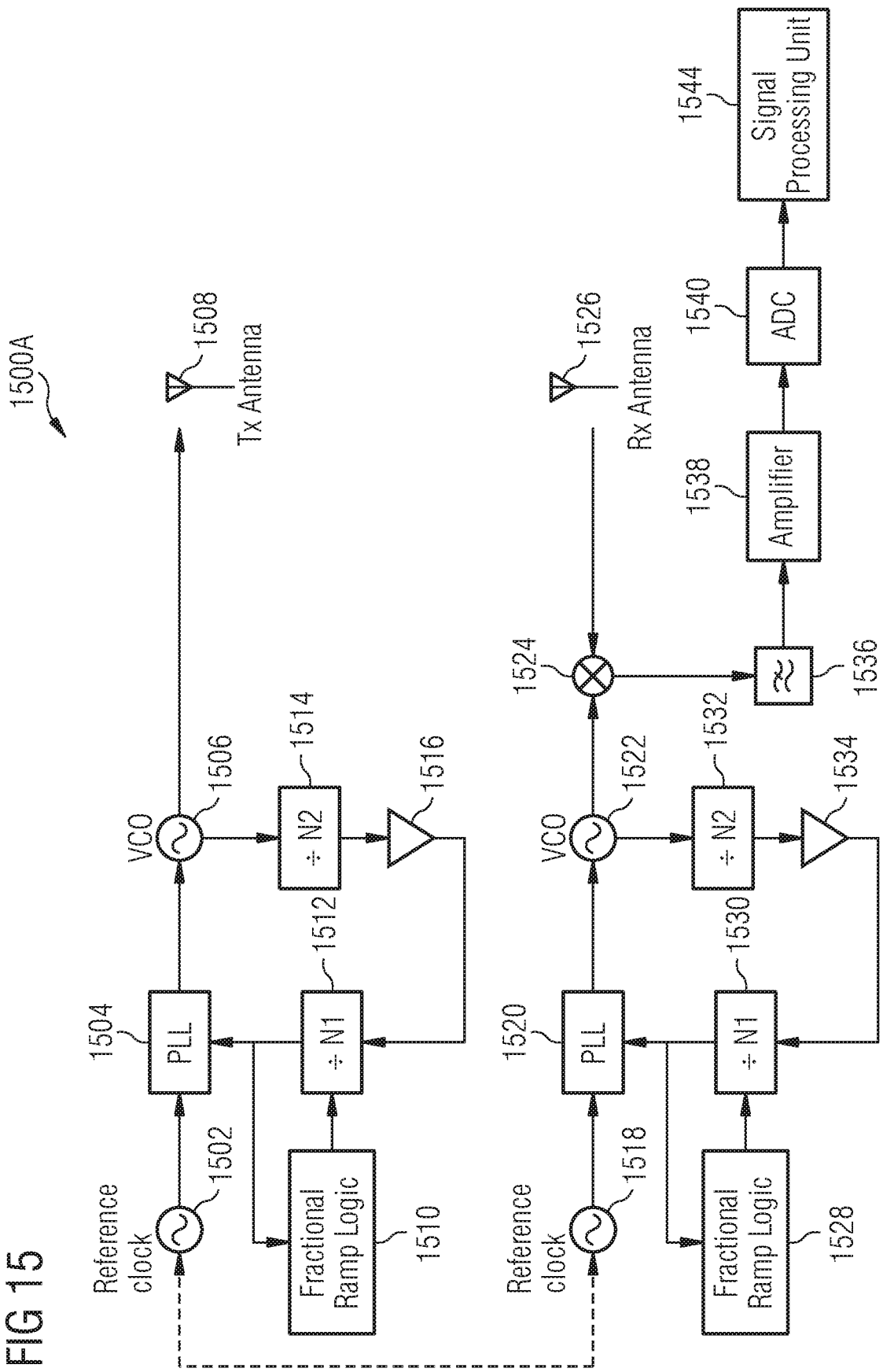
FIGS. 15-18 are block diagrams of radar system implementations according to embodiments.

A block diagram of system implementation 1500A using separate transmit and receive Phase-Locked Loops (PLLs) 1504 and 1520 is shown in FIG. 15. System implementation 1500A includes synchronized reference clocks 1502 and 1518 for the transmit and receive paths.

In the transmit path PLL 1504 receives the synchronized clock signal, and is coupled to a divide-by-N1 circuit 1512 and a fractional ramp logic circuit 1510. The fractional ramp logic circuit 1510 allows the frequency offsets to be generated. The output of PLL 1504 is received by VCO 1506. A first output of VCO 1506 is received by divide-by-N2 circuit 1514 and buffered by buffer amplifier 1516. The output of buffer amplifier 1516 is coupled to an input of divide-by-N1 circuit 1512. VCO 1506 is also used to drive a single transmit antenna 1508.

In the receive path PLL 1520 receives the synchronized clock signal, and is coupled to a divide-by-N1 circuit 1530 and a fractional ramp logic circuit 1528. The fractional ramp logic circuit 1510 allows the frequency offsets to be analyzed. The output of PLL 1520 is received by VCO 1522. A first output of VCO 1522 is received by divide-by-N2 circuit 1532 and buffered by buffer amplifier 1534. The output of buffer amplifier 1534 is coupled to an input of divide-by-N1 circuit 1530. VCO 1522 is also coupled to mixer 1524. Mixer 1524 is also coupled to a single receive antenna 1526. An output of mixer 1524 is coupled to a low pass filter 1536. The output of the low pass filter 1536 is amplified by amplifier 1538, which is converted to a digital signal by ADC 1540 and analyzed by signal processing circuitry 1544.

Figure 16:
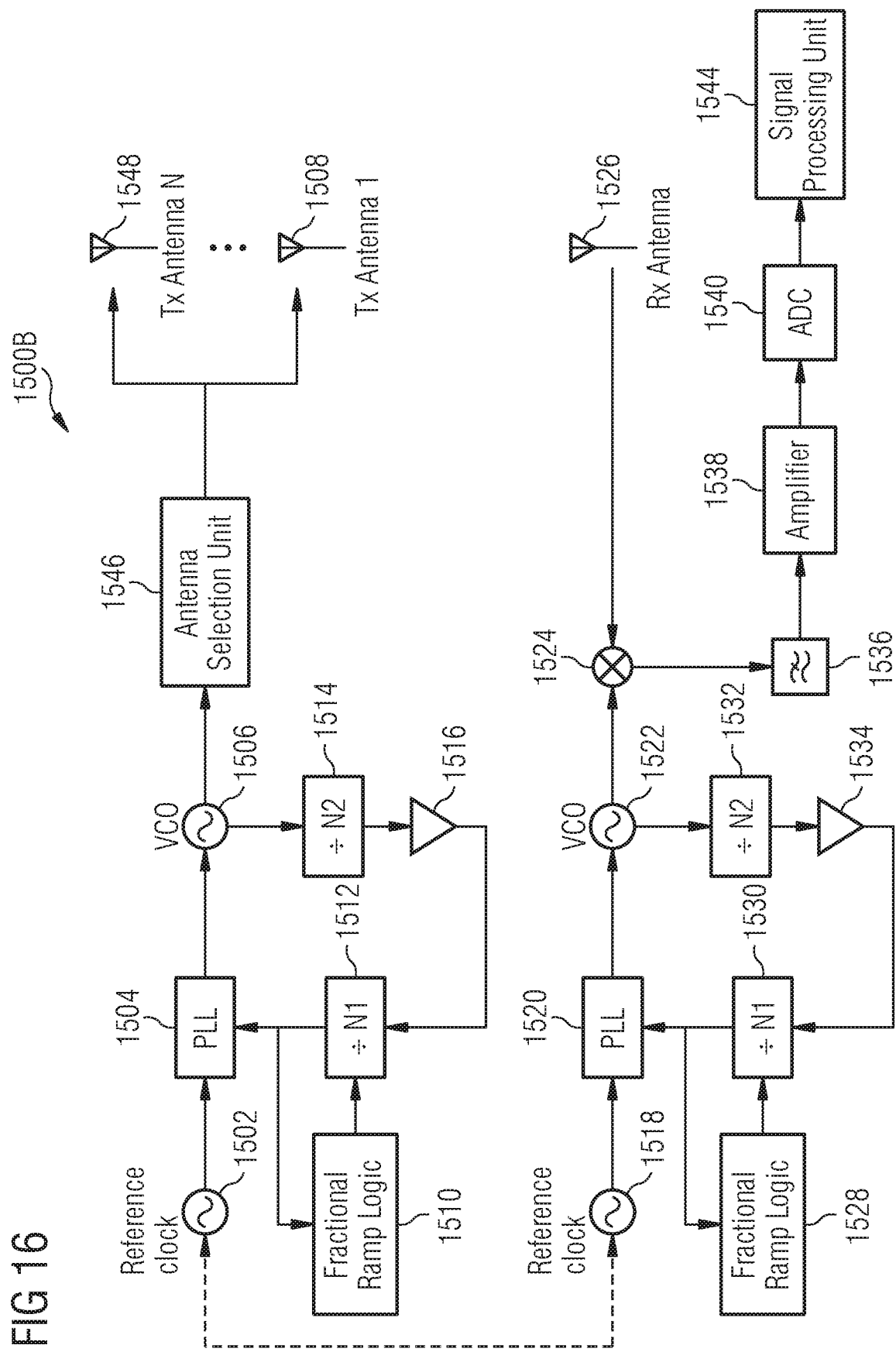

A block diagram of system implementation 1500B using separate transmit and receive Phase-Locked Loops (PLLs) 1504 and 1520 is shown in FIG. 16. The description of system implementation 1500B is similar to the description of system implementation 1500A, except that multiple antennas 1508 through 1548 are used. System implementation 1500B thus can be used to accommodate the multiple antenna method of operation previously described. System implementation 1500B includes an antenna selection unit 1546 coupled to VCO 1506, which is in turn coupled to multiple transmit antennas 1508 through 1548.

Figure 17:
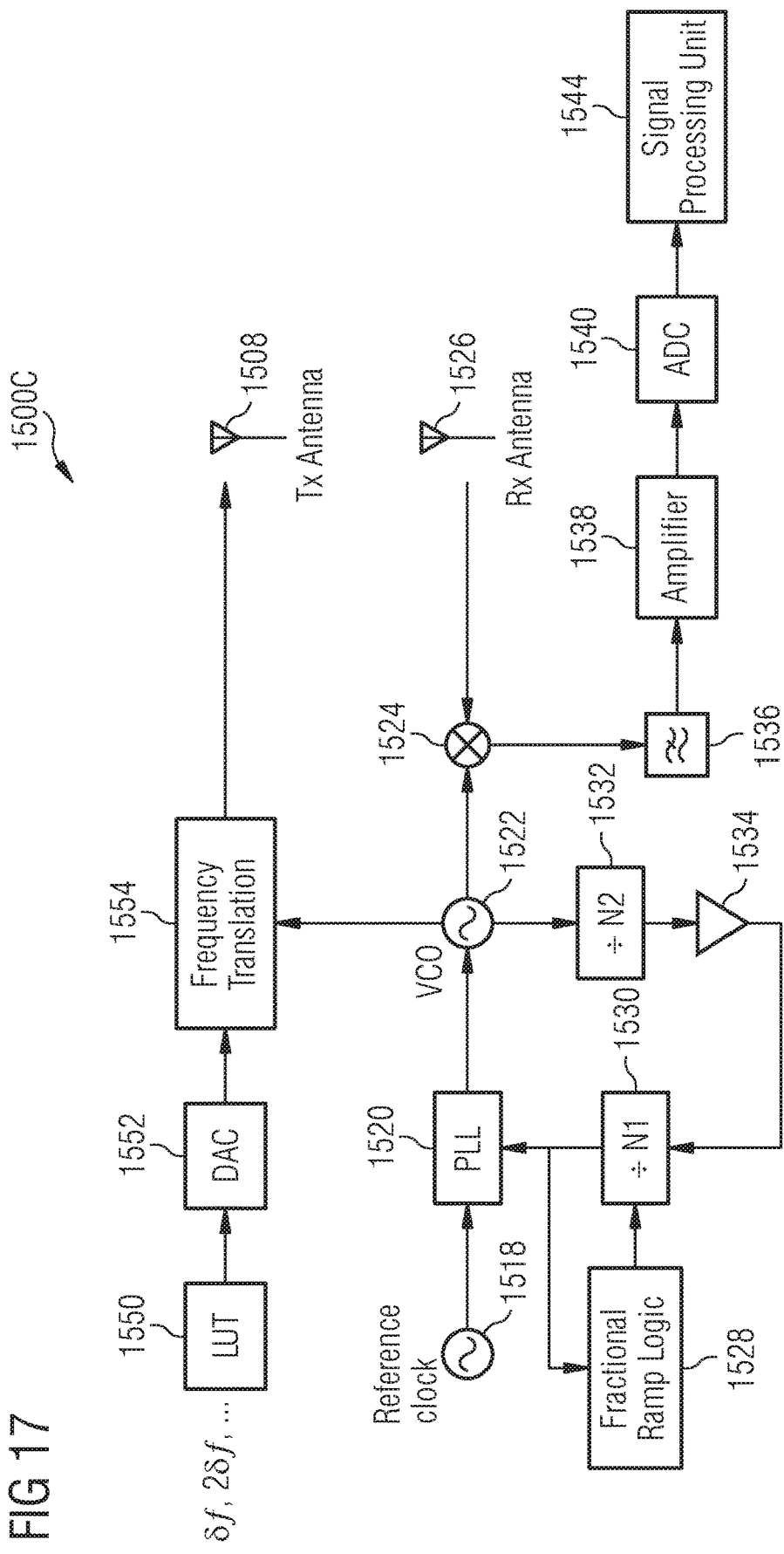

A block diagram of system implementation 1500C using a Numerically-Controlled Oscillator (NCO) in the transmit path and a PLL 1520 in the receive path is shown is FIG. 17. The description of system implementation 1500C is similar to the description of system implementation 1500A, except for the NCO. System implementation 1500C includes a Lookup Table (LUT) 1550 for generating the frequency offsets, a DAC 1552, and a frequency translation circuit 1554. Frequency translation circuit 1554 receives an output from VCO 1522 and drives transmit antenna 1508.

Figure 18:
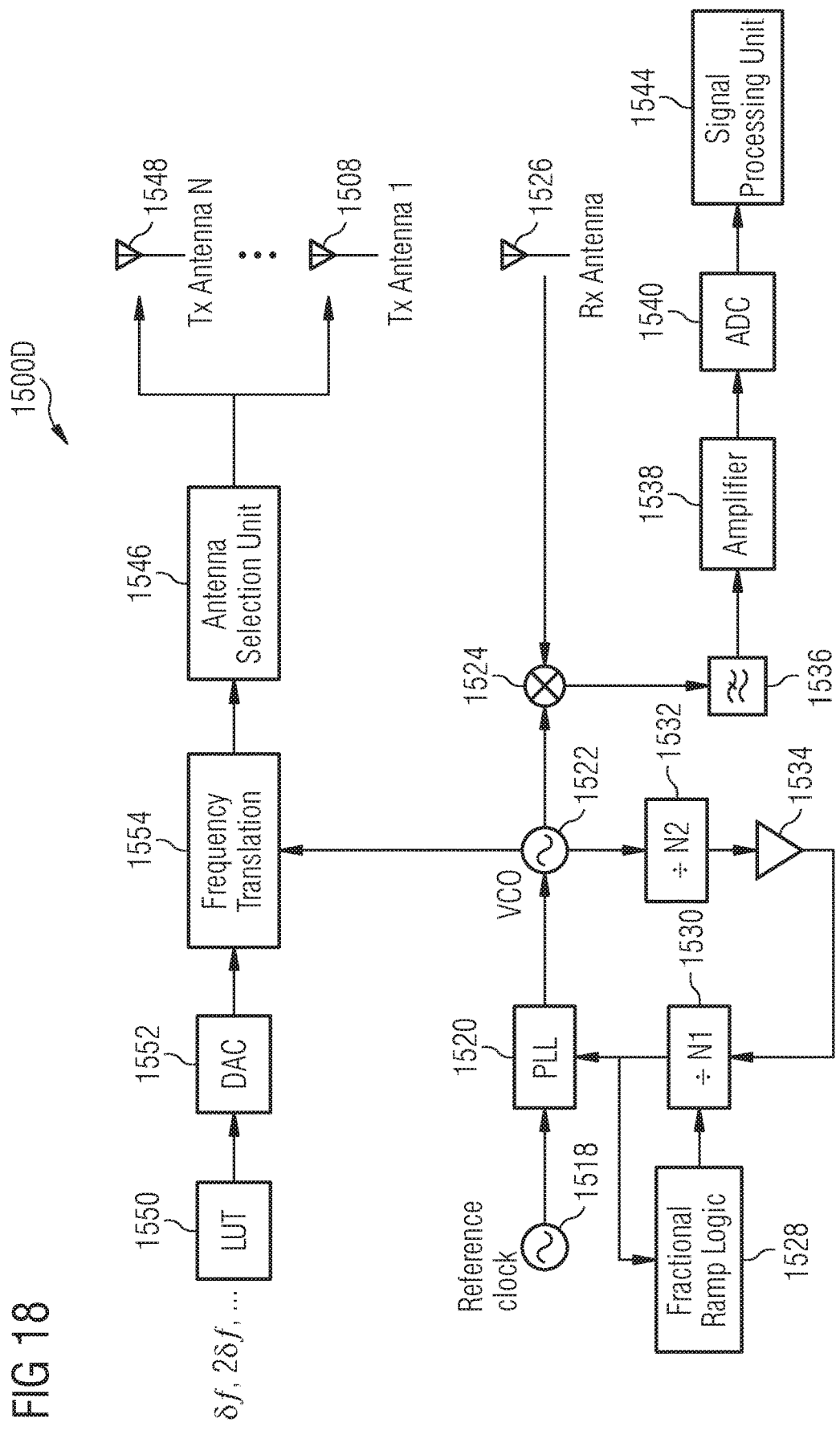

A block diagram of system implementation 1500D using a Numerically-Controlled Oscillator (NCO) in the transmit path and a PLL 1520 in the receive path is shown in FIG. 18. The description of system implementation 1500D is similar to the description of system implementation 1500C, except that multiple antennas 1508 through 1548 are used. System implementation 1500D thus can be used to accommodate the multiple antenna method of operation previously described. System implementation 1500D includes an antenna selection unit 1546 coupled to VCO 1506, which is in turn coupled to multiple transmit antennas 1508 through 1548.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for determining the range of an object comprising:
    transmitting a plurality of successive radar chirps;
    adding a frequency offset to at least one of the plurality of successive radar chirps such that the frequency offset occurs between each of the plurality of successive radar chirps, the frequency offset being a fraction of a range frequency bin;
    receiving a corresponding plurality of return signals;
    constructing a plurality of frequency transforms from the plurality of return signals;
    adding each of the frequency transforms together to create a composite frequency transform; and
    interpolating the range of the object from a frequency peak detected in the composite frequency transform.

2. The method of claim 1, wherein each of the plurality of successive radar chirps comprises a sawtooth frequency sweep.

3. The method of claim 1, wherein each of the plurality of successive radar chirps comprises a staircase frequency sweep.

4. The method of claim 1, wherein the number of the plurality of successive radar chirps is determined by the number of frequency offsets used.

5. The method of claim 1, wherein the plurality of successive radar chirps is transmitted on a single antenna.

6. The method of claim 1, wherein each of the plurality of successive radar chirps is transmitted on a corresponding different single antenna of a plurality of antennas.

7. The method of claim 1, wherein transmitting the plurality of successive radar chirps towards the object is accomplished using a first PLL and receiving the corresponding plurality of return signals from the object is accomplished using a second PLL.

8. The method of claim 1, wherein transmitting the plurality of successive radar chirps towards the object is accomplished using a PLL and receiving the corresponding plurality of return signals from the object is accomplished using an NCO.

9. A system for determining the range of an object comprising:
    at least one antenna configured for transmitting a plurality of successive radar chirps;
    a transmitter configured for adding a frequency offset to at least one of the plurality of successive radar chirps such that the frequency offset occurs between each of the plurality of successive radar chirps, the frequency offset being a fraction of a range frequency bin;
    at least one antenna configured for receiving a corresponding plurality of return signals; and
    a receiver configured for constructing a plurality of frequency transforms from the plurality of return signals, adding each of the frequency transforms together to create a composite frequency transform, and interpolating the range of the object from a frequency peak detected in the composite frequency transform.

10. The system of claim 9, wherein each of the plurality of successive radar chirps comprises a sawtooth frequency sweep.

11. The system of claim 9, wherein each of the plurality of successive radar chirps comprises a staircase frequency sweep.

12. The system of claim 9, wherein the number of the plurality of successive radar chirps is determined by the number of frequency offsets.

13. The system of claim 9, wherein the at least one antenna configured for transmitting a plurality of successive radar chirps is a single antenna.

14. The system of claim 9, wherein the at least one antenna configured for transmitting a plurality of successive radar chirps comprises a plurality of antennas, each antenna configured for transmitting a corresponding one of the plurality of successive radar chirps.

15. The system of claim 9, wherein the transmitter comprises a first PLL and the receiver comprises a second PLL.

16. The system of claim 9, wherein the transmitter comprises a PLL and the receiver comprises an NCO.

17. A method for determining the range of an object comprising:
    transmitting a plurality of pulses;
    adding a frequency offset to at least one of the plurality of pulses;
    receiving a plurality of return signals;
    constructing a plurality of frequency transforms from the plurality of return signals;
    adding each of the frequency transforms together to create a composite frequency transform; and
    determining the range of the object from a maximum frequency peak in the composite frequency transform.

18. The method of claim 17, wherein each of the plurality of pulses comprises a sawtooth frequency sweep.

19. The method of claim 17, wherein each of the plurality of pulses comprises a staircase frequency sweep.

20. The method of claim 17, wherein the plurality of pulses are transmitted on a plurality of antennas.

* * * * *